United States Patent [19]

Knight

[11] 3,992,676

[45] Nov. 16, 1976

[54] CURRENT AMPLIFIERS

[75] Inventor: Mark Berwyn Knight, North Caldwell, N.J.

[73] Assignee: RCA Corporation, New York, N.Y.

[22] Filed: Dec. 10, 1975

[21] Appl. No.: 639,362

[52] U.S. Cl. .................................... 330/18; 330/19; 330/20; 330/22; 330/25; 330/30 R; 330/40

[51] Int. Cl.[2] ............................................ H03F 3/42

[58] Field of Search .................. 330/19, 20, 22, 25, 330/38 M, 40, 18, 30 R; 307/256, 297

[56] References Cited

UNITED STATES PATENTS 3,939,434 2/1976 Crosby ........................ 330/38 M X

*Primary Examiner*—James B. Mullins

*Attorney, Agent, or Firm*—H. Christoffersen; S. Cohen; A. L. R. Limberg

[57] ABSTRACT

Conventionally, the common-emitter current gain $h_{fe}$ of a first transistor is reduced to a better-defined value -G by shunting the series connection of its base-emitter junction and emitter degeneration resistor with the series connection of a self-biased, second transistor and a further resistor. By including, per the present invention, a still further resistor in the collector-to-base connection of the second transistor, properly proportioned relative to the other resistors, a second-order dependence of -G upon $h_{fe}$ can be significantly reduced.

12 Claims, 7 Drawing Figures

Fig.5.
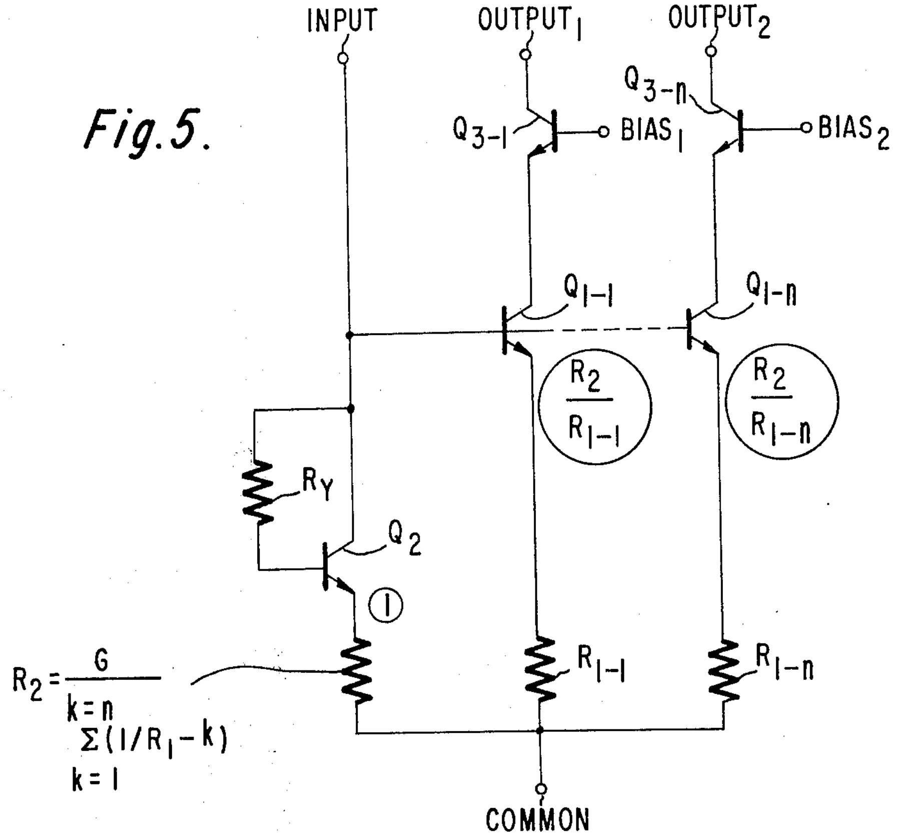
Fig.6.
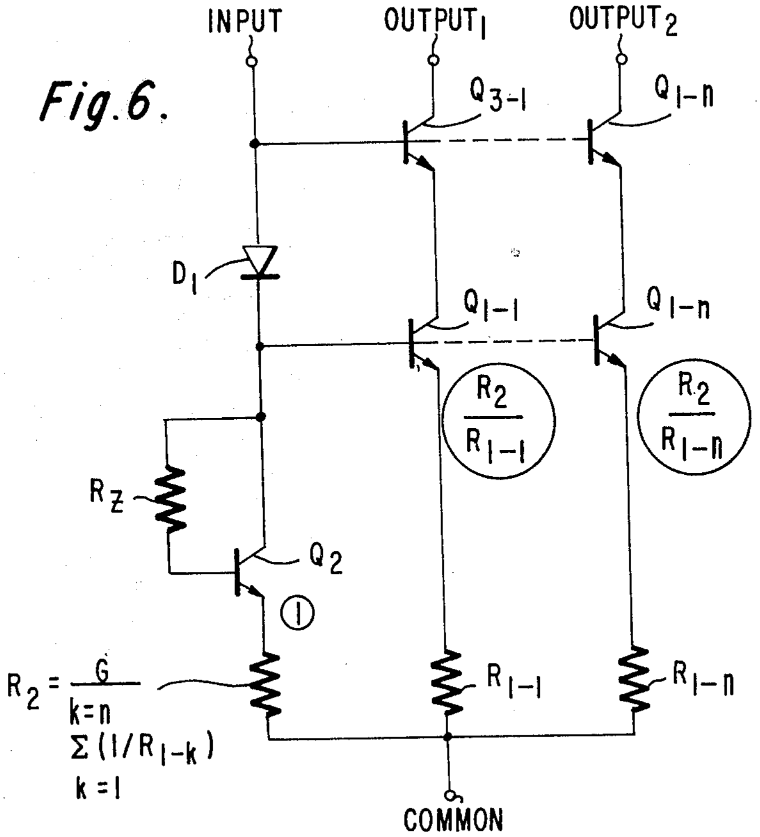
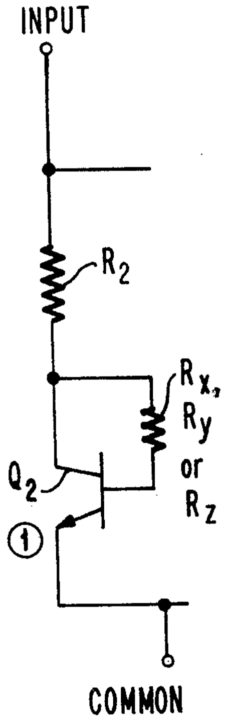
Fig. 7

CURRENT AMPLIFIERS

The present invention relates to improved current amplifiers of the sort commonly referred to as current mirror amplifiers and employed in monolithic integrated circuitry.

In a known mirror amplifier, the common-emitter amplifier current gain of a first transistor ($Q_1$) is reduced by shunting the series connection of its base-emitter junction and emitter-degeneration resistor ($R_1$) with the series connection of a second, self-biased transistor ($Q_2$) and a further resistor ($R_2$). It is found that despite the use of the emitter-degeneration and further resistors ($R_1$, $R_2$) the current gain of the current mirror amplifier exhibits a second-order dependence upon the common-emitter forward current gains ($h_{fe}$'s) of the transistors ($Q_1$, $Q_2$). This dependence is undesirable in many precision circuits.

In current mirror amplifiers embodying the present invention, this dependence is reduced by including a resistor in the collector-to-base connection of the second transistor, which resistor has a resistance properly proportioned to the resistance of the emitter degeneration resistor.

In the drawing:

FIGS. 4, 5 and 6 show modifications of the FIGS. 1, 2 and 3 circuits, respectively, to provide pluralities of output currents and;

FIG. 7 is a schematic diagram of an alternative arrangement of certain elements in the various figures.

Figure 1:
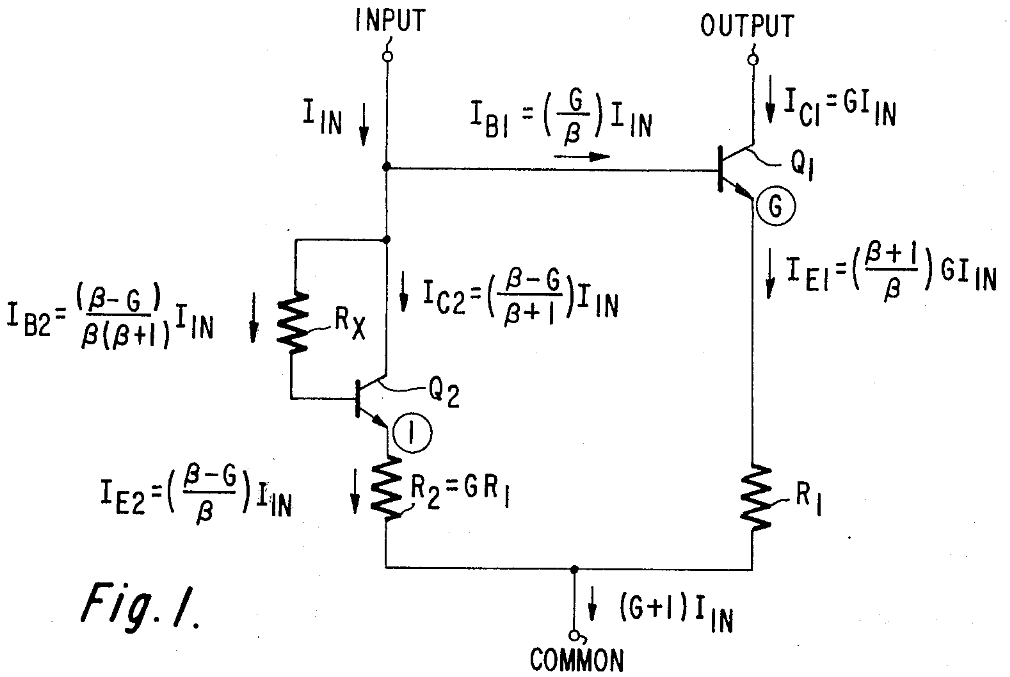
FIG. 1 is a schematic diagram of an improved current amplifier embodying the present invention.

The current mirror amplifier of FIG. 1 is to be designed to have a current gain of $-G$ between its INPUT and OUTPUT terminals and to have a current gain of $(G+1)$ between its INPUT and COMMON terminals, G being a positive number. The resistances of the emitter degeneration resistor $R_1$ and further resistor $R_2$ will also be identified as $R_1$ and $R_2$, respectively. In the prior current mirror amplifier $R_1:R_2::1:G$ and the desirability of continuing this practice in the improved current mirror amplifier is demonstrated below.

If the densities of current flow in the base-emitter junctions of two transistors, operated at the same temperature, differ by only a small percentage, their base-emitter potentials differ by only about one-quarter millivolt for each percentage point of that difference. Since the relative emitter currents of $Q_1$ and $Q_2$ perforce must be in nearly G:1 ratio to achieve the desired current mirror amplifier gain, by making the relative effective areas of the base-emitter junctions of $Q_1$ and $Q_2$ in G:1 ratio (indicated by the circled characters), per conventional practice, the difference between the base-emitter offset potentials $V_{BE1}$ and $V_{BE2}$ of $Q_1$ and $Q_2$, respectively, can be made extremely small. By choosing $R_1$ and $R_2$ sufficiently large to cause a several millivolt drop across each during current amplification, the effect of $V_{BE1} - V_{BE2}$ upon the current gains of the current mirror amplifiers will be inconsequential, whether or not this optimum proportion between the areas of the base-emitter junctions of $Q_1$ and $Q_2$ exists.

In the prior art current mirror amplifier, where a direct connection without substantial resistance instead of $R_X$ appears between the base and collector electrode of transistor $Q_2$, the identical potential drop appears across a first series combination, that of the base-emitter junction of $Q_1$ and $R_1$, and across a second series combination, that of the base-emitter junction of $Q_2$ and $R_2$. Since the impedance of the first series combination is $1/G$ times that of the second series combination, in accordance with Ohm's Law, the emitter current $I_{E1}$ of $Q_1$ is G times as large as the emitter current $I_{E2}$ of $Q_2$. The departure of the current gain of the prior art current mirror amplifier from its desired value $-G$ is attributable to the common-base amplifier action of $Q_1$ (a) causing its collector current $I_{C1}$ flowing through the OUTPUT terminal to be smaller than $I_{E1}$ by a factor $h_{fb} = h_{fe}/(h_{fe}+1)$ and (b) at the same time augmenting the flow of $I_{E2}$ through the INPUT terminal with its base current $I_{B1}$. The present inventor found that in an improved current mirror amplifier, this undesirable departure could be substantially lessened by making the potential drop across the first series combination larger than that across the second by the voltage drop across a resistor $R_X$ included in the collector-to-base connection of $Q_2$. Further, as shall be shown below, he found that desired resistance of resistor $R_X$ is substantially independent of the current levels at which the improved current mirror amplifier is operated. Also, if the $h_{fe}$'s of the transistors are substantially larger than unity and G, the desired resistance, is in a simple proportional relationship to the resistances of $R_1$ and $R_2$.

To demonstrate that these results obtain in the FIG. 1 amplifier, first assume $R_X$ does facilitate the desired result: a current $GI_{IN}$ flowing into the OUTPUT terminal in response to a current $I_{IN}$ being caused to flow into the INPUT terminal. The currents $I_{B1}$, $I_{E1}$, $I_{E2}$, $I_{B2}$ and $I_{C2}$ in the various branches of the circuit may be calculated in that order in accordance with (a) Kirchoff's Law of Currents; (b) the assumption that $Q_1$ and $Q_2$ both have like $h_{fe}$'s of $\beta$; and (c) that the base, collector and emitter currents of any transistor are in $1:h_{fe}:(1+h_{fe})$ ratio, respectively. These calculated currents are shown in FIG. 1.

The potential between the COMMON and INPUT terminals is applied to two branches of the circuit, permitting the following equation to be written in accordance with Kirchoff's Law of Potential.

$$I_{E2} R_2 + V_{BE2} + I_{B2} R_X = V_{BE1} + I_{E1} R_1 \qquad (1)$$

As noted above, $V_{BE1}$ and $V_{BE2}$ are equal in the preferred embodiment of the invention where the effective areas of the base-emitter junctions of $Q_1$ and $Q_2$ are in G:1 ratio, and are nearly equal in other amplifiers. This permits the following equation to be written.

$$I_{E2} R_2 + I_{B2} R_X = I_{E1} R_1 \qquad (2)$$

The value of the emitter current $I_{E1}$ of $Q_1$ and the values of the emitter current $I_{E2}$ and base current $I_{B2}$ of $Q_2$ as shown in FIG. 1 can be substituted into equation 2 and the resulting equation solved in terms of $R_X$ to yield equation 3.

$$R_X = [(\beta+1)^2 G R_1/(\beta-G)] - (\beta+1) R_2 \qquad (3)$$

The desirability of $R_2 = GR_1$ has been previously indicated. This substitution, which results in equation 4, also has the felicitous result of removing a square-law dependence of $R_X$ upon $\beta$.

$$R_X = (G+1)GR_1(\beta+1)/(\beta-G) = (G+1)R_2(\beta+1)/(\beta-G) \qquad (4)$$

In a preferred circuit according to FIG. 1, $\beta$ is substantially larger than both 1 and $G$. The term $(\beta+1)/(\beta-G)$ therefore is substantially unity-valued, that is, the $\beta$'s of the individual transistors no longer have any substantial effect on the gain $G$ of the amplifier. In mathematical terms, $R_X = (G+1)R_2 = (G+1)GR_1$; that is, the design relationship among $R_1$, $R_2$ and $R_X$ which substantially reduces the dependence of the current gain of the current mirror amplifier of FIG. 1 upon $h_{fe}$ is:

$$R_1 : R_2 : R_X :: 1 : G : G(G+1). \qquad (5)$$

Figure 2:
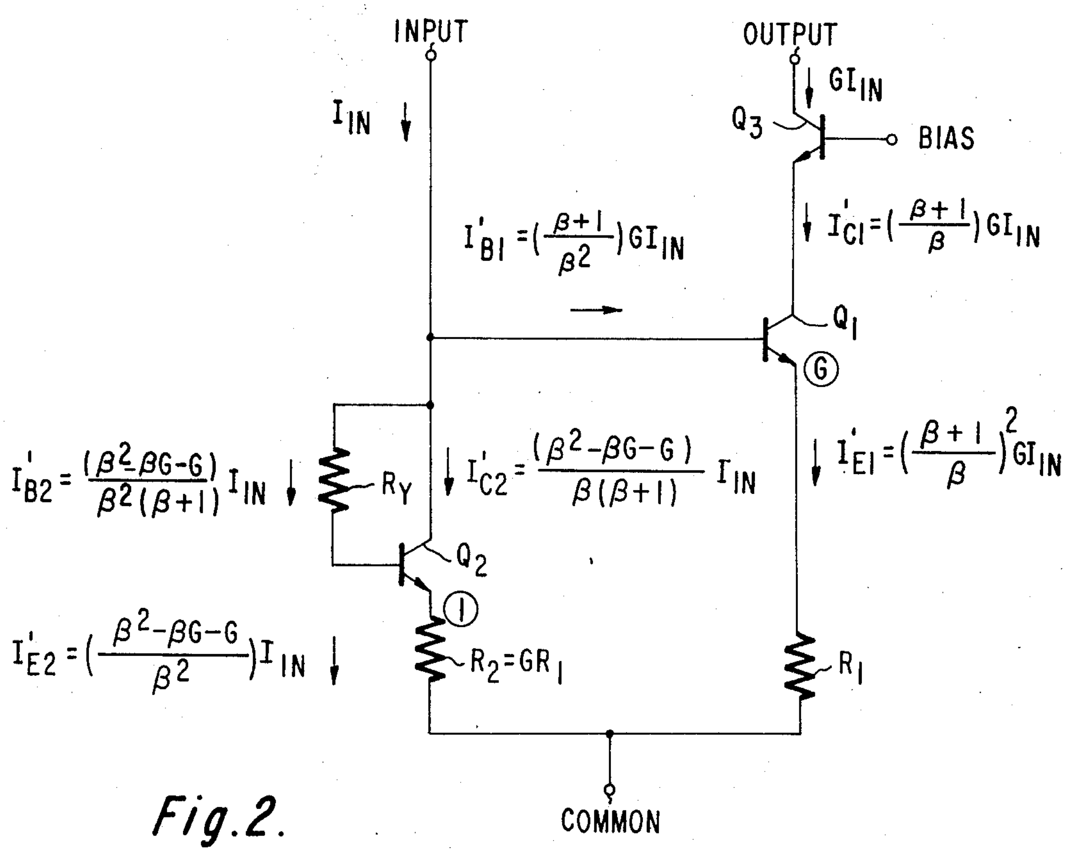
FIG. 2 is a schematic diagram of a second embodiment of the invention, this one including a current mirror amplifier connected to supply emitter current to a subsequent transistor, with the collector current of the further transistor being maintained in substantially $h_{fe}$-independent proportion to the current mirror amplifier input current.

FIG. 2 shows a current mirror amplifier similar in structure to that of FIG. 1 supplying its output current to the emitter electrode of a further transistor $Q_3$. $Q_3$ may be in cascode connection with $Q_1$ for realizing a more complex current mirror amplifier structure with higher output impedance, for example. $Q_3$ alternatively might represent the d-c equivalent circuit of a pair of emitter-coupled differential amplifier transistors provided constant-current biasing of their joined emitter electrodes from the collector electrode of $Q_1$. Applying the same type of analysis as applied to the FIG. 1 circuit, the following resistance value for $R_Y$ is shown necessary to maintain in 1:$G$ ratio the currents flowing into the INPUT and OUTPUT terminals of the FIG. 2 circuit.

$$R_Y = [(G+2)\beta^2+(3+2G)\beta+(G+1)]GR_1/(\beta^2-\beta G-G) \qquad (6)$$

Particularly for larger values of $\beta$, $R_Y$ is substantially $\beta$-independent and the following design relationship is desirable.

$$R_1 : R_2 : R_Y :: 1 : G : G(G+2) \qquad (7)$$

A more general relationship can be derived to describe the approximate desired design relationship to get $h_{fe}$-independent current gain for cascade connections of P transistors in the output current path, viz:

$$R_1 : R_2 : R_Y :: 1 : G : G(G+P) \qquad (8)$$

Figure 3:
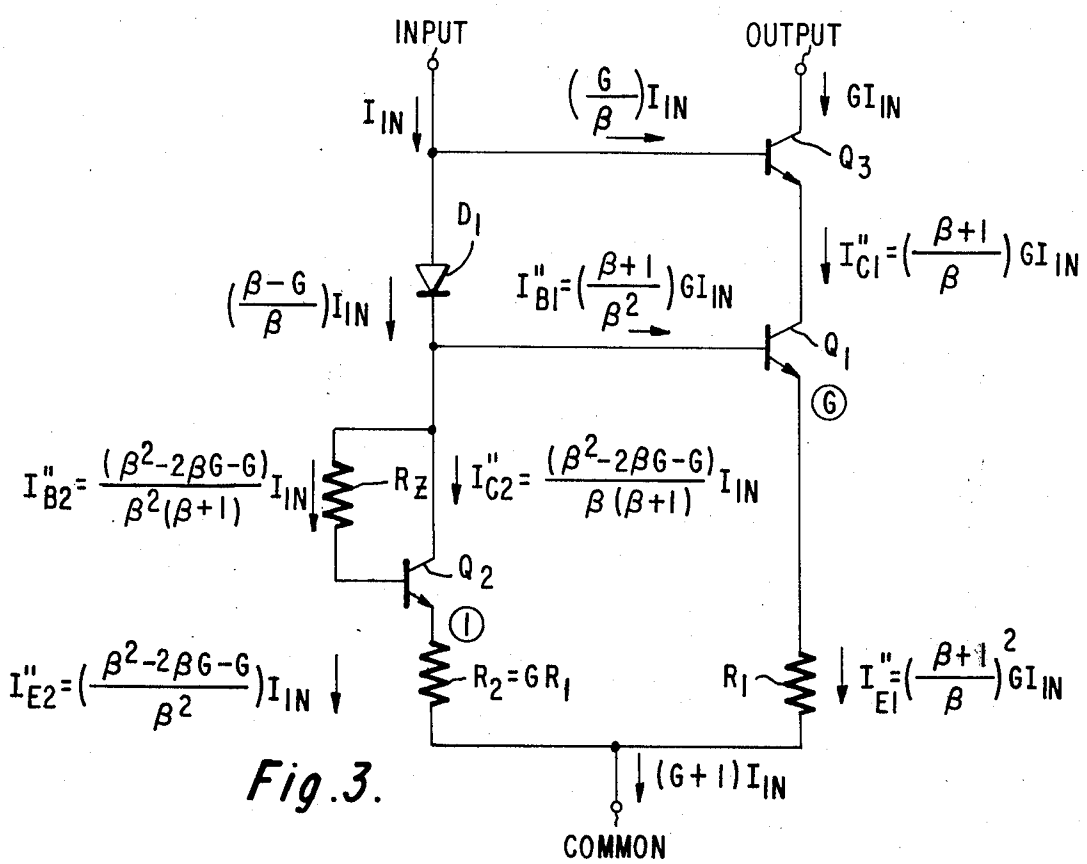
FIG. 3 is a schematic diagram of a current mirror amplifier with cascode output stage modified to embody the present invention.

FIG. 3 shows a current mirror amplifier with self-biased cascade output stage, the current gain of which can be made more $h_{fe}$-independent by using $R_Z$ in place of a direct connection. Ideally, $R_Z$ should have the following resistance value, as determined by the analysis technique employed in connection with the FIG. 1 circuit.

$$R_z = (2\beta^2+3\beta+1)\ (G+1)\ G\ R_1/(\beta^2-2G\beta^{-G}) \qquad (9)$$

Practically, the following design relationship is desirable.

$$R_1 : R_2 : R_Z :: 1 : G : 2G(G+1) \qquad (10)$$

Figure 4:
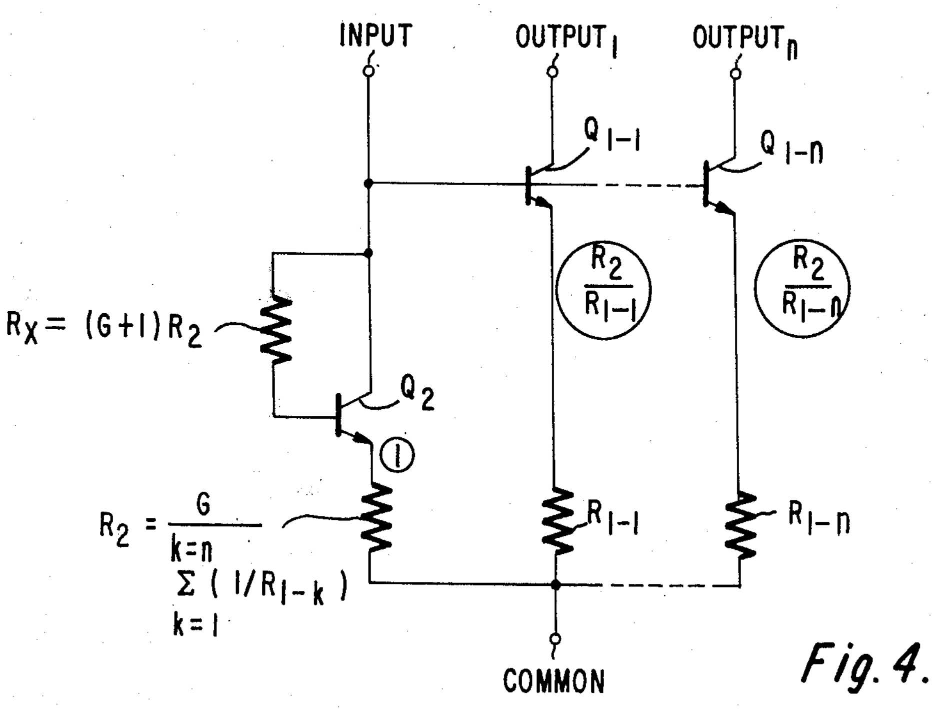

FIG. 4 shows a plural output current mirror amplifier. It has a plurality, $n$, of transistors $Q_{1-1}, \ldots Q_{1-n}$ with respective emitter degeneration resistors $R_{1-1}, \ldots R_{1-n}$. They require the same $h_{fe}$ compensation as the single output current mirror amplifier of FIG. 1, where $R_1$ is equal to the parallelled resistances of $R_{1-1}, \ldots R_{1-n}$. The FIGS. 5 and 6 circuits are analogous to the FIGS. 2 and 3 circuits, in much the same way the FIG. 4 circuit is analogous to the FIG. 1 circuit.

The order of the self-biased transistor $Q_2$ and $R_2$ in their series combination may be reversed so that $R_X$, $R_Y$ or $R_Z$ may share a common contact with $R_2$. This is shown schematically in FIG. 7. The teaching of the present invention also may be extended to other types of current mirror amplifiers.

What is claimed is:

1. In a current amplifier of the type having input, common and output terminals;
 - a first junction transistor having a base electrode to which said input terminal is direct-coupled, having a collector electrode direct coupled to said output terminal, and having an emitter electrode;
 - a first resistance of value $R_1$ connecting said emitter electrode of said first transistor to said common terminal;
 - a second transistor having an emitter electrode connected to said common terminal, having collector and base electrodes, and having a direct-coupled collector-electrode-to-base-electrode feedback connection connecting its collector electrode to its base electrode, whereby it operates as a self-biased transistor; and
 - a second resistance of value $R_2$ connected between said input terminal and the collector electrode of said second transistor, $R_2$ being substantially G times $R_1$ in resistance, the gain of said current amplifier as between its input and output terminals tending as a result of the foregoing connections of elements to be −G; the improvement comprising:
 - a third resistance included in said direct-coupled collector-electrode-to-base-electrode feedback connection of said second transistor of a value for making the current gain of said current amplifier as between said input and output terminals more nearly equal to −G.

2. An improved current amplifier as set forth in claim 1 wherein said first and second transistors have common emitter forward current gains that are substantially equal to each other and appreciably larger than both unity and G, said output terminal is at the collector electrode of said first transistor and said third resistance is of value $R_X$, $R_X$ being substantially $G(G+1)$ times as large as $R_1$.

3. In a current amplifier of the type having input, common and output terminals;
 - a first junction transistor having a base electrode to which said input terminal is direct coupled, having a collector electrode direct coupled to said output terminal, and having an emitter electrode;
 - a first resistance of value $R_1$ connecting said emitter electrode of said first transistor to said common terminal;
 - a second resistance of value $R_2$, $R_2$ being substantially G times $R_1$;
 - a second junction transistor having base and emitter and collector electrodes, and having a direct-coupled colletor-electrode-to-base-electrode feedback connection, whereby it operates as a self-biased transistor arranged in series connection with said second resistance between the base electrode of said first transistor and said common terminal; the gain of said current amplifier as between its input and output terminals tending as a result of the foregoing connections of elements to be −G;

a third junction transistor of the same conductivity type as said first transistor, having an emitter electrode to which the collector electrode of said first transistor is connected, having a collector electrode connected to said output terminal, and having a base electrode, said third junction transistor thereby serving as the means for direct coupling the collector electrode of said first junction transistor to said output terminal; and means for applying a bias potential between said common terminal and the base electrode of said third transistor;

said first and second transistors having common-emitter forward current gains that are substantially equal to each other and appreciably larger than both unity and G; the improvement comprising:

a third resistance included in said direct-coupled collector-electrode-to-base-electrode feedback connection of said second transistor for making the current gain of said current amplifier as between said input and output terminals more nearly equal to −G, which said third resistance is of value $R_Y$, $R_Y$ being substantially $G(G+2)$ times $R_1$.

4. In a current amplifier of the type having input, common and output terminals;

a first junction transistor having a base electrode to which said input terminal is direct coupled, having a collector electrode direct coupled to said output terminal, and having an emitter electrode;

a first resistance of value $R_1$ connecting said emitter electrode of said first transistor to said common terminal;

a second resistance of value $R_2$, $R_2$ being substantially G times $R_1$;

a second junction transistor having base, emitter and collector electrodes, and having a direct-coupled collector-electrode-to-base-electrode feedback connection, whereby it operates as a self-biased transistor arranged in series connection with said second resistance between the base electrode of said first transistor and said common terminal; the gain of said current amplifier as between its input and output terminals tending as a result of the foregoing connections of elements to be −G; and a third junction transistor of the same conductivity type as said first transistor having an emitter electrode to which the collector electrode of said first transistor is connected, having a collector electrode connected to said output terminal, and having a base electrode connected to said input terminal, said third junction transistor thereby serving as the means for direct coupling the collector electrode of said first junction transistor to said output terminal, wherein said first and second transistors have common emitter forward current gains that are substantially equal to each other and appreciably larger than both unity and G:

the improvement comprising a third resistance included in said direct-coupled collector-electrode-to-base-electrode feedback connection of said second transistor for making the current gain of said current amplifier as between said input and output terminals more nearly equal to −G, which third resistance is of value $R_Z$, $R_Z$ being substantially $2G(G+1)$ times $R_1$.

5. In a current amplifier, comprising, in combination: input, common and output terminals;

first and second resistances in one to G ratio, respectively, with each other, G being a positive number;

a plurality P of output transistors, each having base and emitterr and collector electrodes and being of the same conductivity type as the others, P being a positive number;

means connecting said output transistors in cascade relationship with each other, including a connection of said input terminals to the base electrode of a first of said output transistors, a connection of said first resistance between the emitter electrode of said first of said output transistors and said common terminal, a connection of the emitter electrode of each succeeding output transistor in said cascade relationship to the collector electrode of the preceeding output transistor, a connection of the collector electrode of the last of said output transistors to said output terminal, and means for biasing the base electrode of each of said output transistors other than the first;

an input junction transistor having base and emitter and collector electrodes, and having a direct-coupled collector-electrode-to-base-electrode feedback connection whereby it operates as a self-biased transistor in series connection with said second resistance between said input terminal and said common terminal; the improvement comprising:

a third resistance substantially $(G+P)$ times said second resistance includes in said direct-coupled collector-electrode-to-base-electrode feedback connection for making the current gain of said current amplifier as between said input and output terminals more nearly equal to −G.

6. In a current mirror amplifier of the type including: an input terminal, a plurality n in number of output terminals, and a common terminal;

a plurality $n$ in number of output junction transistors, each having a respective base and respective emitter and respective collector electrodes;

means for connecting said input terminal to an interconnection of the base electrodes of said output transistors;

means for coupling each of the collector electrodes of said output transistors to a respective separate one of said output terminals, the first of said plurality of output transistors being coupled to the first of said plurality of output terminals;

a plurality $n$ in number of resistors, each having a respective first end connected to a respective one of the emitter electrodes of said output transistors and having a respective second end connected to said common terminal, the first of said plurality of resistors being connected between the emitter electrode of said first transistor and said common terminal;

a further resistor having a resistance G times the reciprocal of the sum of the reciprocals of the resistances of said plurality of resistors; and an input junction transistor having base and emitter and collector electrodes, and having a direct-coupled collector-electrode-to-base-electrode feedback connection, whereby it operates as a self-biased transistor, said input transistor being connected in series with said further resistor between said common terminal and said interconnection of the base electrodes of said output transistors; the improvement comprising:

a still further resistor included in said direct-coupled collector-to-base feedback connection of said input transistor, said still further resistor having a resistance of a value for making the current gain of said current amplifier as between said input and the first of its output terminals more nearly equal to the resistance of said further resistor divided by the resistance of said first resistor.

7. An improved current mirror amplifier as set forth in claim 6 wherein said still further resistor has a resistance substantially ($G$+1) times that of said further resistor, said improved current mirror amplifier including in said means for coupling each of the collector electrodes of said output transistors to a respective one of said output terminals:

a direct connection between said first output terminal and the collector electrode of the said first output transistor.

8. An improved current mirror amplifier as set forth in claim 6 wherein said still further resistor has a resistance substantially ($G$+2) times that of said further resistor and wherein said means for coupling each of the collector electrodes of said output transistor to a respective one of said output terminals includes:

a further transistor having an emitter electrode connected to the collector electrode of said first output transistor, having a collector electrode connected to said first output terminal, and having a base electrode; and means for applying a bias potential between the base electrode of said further transistor and said common terminal for conditioning said further transistor for cascoding operation in co-operation with said first output transistor.

9. An improved current mirror amplifier as set forth in claim 6 wherein said still further resistor has a resistance substantially 2($G$+1) times that of said further transistor; wherein said means for connecting said input terminal to an interconnection of the base electrodes of said output transistors includes means for maintaining a potential offset between said input terminal and said interconnection; and wherein said means for coupling each of the collector electrodes of said output transistor to a respective one of said output terminals includes a further transistor having a base electrode connected to said input terminal, having an emitter electrode connected to the collector electrode of said first output transistor, and having a collector electrode connected to said first output terminals.

10. An improved current mirror amplifier as set forth in claim 6 wherein said still further resistor has a resistance substantially ($G$+1) times that of said further resistor and wherein said means for coupling each of the collector electrodes of said output transistor to a respective one of said output terminals consists of a direct connection of each of the collector electrodes of said output transistors to its respective said output terminal.

11. An improved current mirror amplifier as set forth in claim 6 wherein said still further resistor has a resistance substantially ($G$+2) times that of said further resistor and wherein said means for coupling each of the collector electrodes of said output transistors to a respective one of said output teminals comprises:

a plurality, $n$ in number, of further transistors having respective emitter electrodes connected to respective ones of the collector electrodes of said output transistors, having respective collector electrodes connected to respective ones of said output terminals, and having respective base electrodes; and means for applying a bias potential between each of the base electrodes of said further transistors and said common terminal for conditioning it for cascade operation in co-operation with the one of said output transistors, the collector electrode of which its emitter electrode is connected to.

12. An improved current mirror amplifier as set forth in claim 6 wherein said still further resistor has a resistance substantially 2($G$+1) times that of said further resistor; wherein said means for connecting said input terminal to an interconnection of the base electrodes of said output transistors includes means for maintaining a potential offset between said input terminal and said interconnection; and wherein said means for coupling each of the collector electrodes of said output transistors to a respective one of said output terminals includes:

a plurality, $n$ in number, of further transistors having respective base electrodes connected to said input terminal, having respective emitter electrodes connected to respective ones of the collector electrodes of said output transistors, and having respective collector electrodes connected to respective ones of said output terminals.

* * * * *

UNITED STATES PATENT OFFICE
CERTIFICATE OF CORRECTION

PATENT NO. : 3,992,676

DATED : November 16, 1976

INVENTOR(S) : Mark Berwyn Knight

It is certified that error appears in the above-identified patent and that said Letters Patent are hereby corrected as shown below:

Column 1, line 8, after "known" insert --current--
Column 3, line 53, "cascade" should read --cascode--
Column 4, line 64, "colletor" should read --collector--
Column 6, line 6, "emitterr" should read --emitter--
Column 6, line 9, "cascade" should read --cascode--
Column 6, line 11, "terminals" should read --terminal--
Column 6, line 17, "cascade" should read --cascode--
Column 6, line 32, "includes" should read --included--
Column 7, line 25, "transistor" should read --transistors--
Column 8, lines 27-28, "cascade" should read --cascode--

Signed and Sealed this

Twenty-sixth Day of April 1977

[SEAL]

*Attest:*

RUTH C. MASON
*Attesting Officer*

C. MARSHALL DANN
*Commissioner of Patents and Trademarks*